(12) United States Patent
Hayashi

(10) Patent No.: US 11,863,171 B2
(45) Date of Patent: Jan. 2, 2024

(54) ELECTRONIC CIRCUITRY, ELECTRONIC SYSTEM, AND DRIVING METHOD

(71) Applicant: KABUSHIKI KAISHA TOSHIBA, Tokyo (JP)

(72) Inventor: Yusuke Hayashi, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 47 days.

(21) Appl. No.: 17/672,583

(22) Filed: Feb. 15, 2022

(65) Prior Publication Data

US 2023/0085390 A1   Mar. 16, 2023

(30) Foreign Application Priority Data

Sep. 10, 2021 (JP) .................................. 2021-147958

(51) Int. Cl.
| | |
|---|---|
| *H03K 17/687* | (2006.01) |
| *H03K 17/0412* | (2006.01) |
| *H02M 3/158* | (2006.01) |
| *H02M 1/08* | (2006.01) |

(52) U.S. Cl.
CPC .......... *H03K 17/6877* (2013.01); *H02M 1/08* (2013.01); *H02M 3/158* (2013.01); *H03K 17/04123* (2013.01)

(58) Field of Classification Search
None
See application file for complete search history.

(56) References Cited

U.S. PATENT DOCUMENTS

| | | | |
|---|---|---|---|
| 6,781,423 B1* | 8/2004 | Knoedgen | H03K 17/6871 327/110 |
| 7,782,098 B2 | 8/2010 | Hashimoto et al. | |
| 8,139,329 B2* | 3/2012 | Martin | H02H 9/046 361/91.1 |
| 8,513,983 B2 | 8/2013 | Machida | |
| 8,648,582 B2* | 2/2014 | Huang | G05F 1/56 323/280 |
| 10,770,883 B2* | 9/2020 | Creech | H01L 27/0266 |
| 10,775,818 B2* | 9/2020 | Tiedemann | H02H 9/04 |
| 11,011,970 B2 | 5/2021 | Okawauchi et al. | |

(Continued)

FOREIGN PATENT DOCUMENTS

| | | |
|---|---|---|
| JP | H9-36724 A | 2/1997 |
| JP | H10-75578 A | 3/1998 |

(Continued)

OTHER PUBLICATIONS

Yusuke Hayashi et al., "Active gate controlled SiC transfer switch for fault tolerant operation of ISOP multicellular dc-dc converter," Proc. of Int'l Conf. on Power Elecs., Drives and Energy Systems (IEEE PEDES) (Trivandrum, Dec. 2016), 6 pages.

*Primary Examiner* — Thomas J. Hiltunen
*Assistant Examiner* — Khareem E Almo
(74) *Attorney, Agent, or Firm* — Finnegan, Henderson, Farabow, Garrett & Dunner, LLP

(57) ABSTRACT

According to one embodiment, electronic circuitry includes a semiconductor switching element; and a driving circuit configured to supply a current to a control terminal of the semiconductor switching element and to adjust a magnitude of the current supplied to the control terminal based on a voltage at the control terminal.

12 Claims, 9 Drawing Sheets

(56) References Cited

U.S. PATENT DOCUMENTS

| | | | |
|---|---|---|---|
| 11,063,516 B1* | 7/2021 | Kim | H02M 1/0006 |
| 2006/0132171 A1* | 6/2006 | Nguyen | H03F 1/56 |
| | | | 326/30 |
| 2016/0142048 A1* | 5/2016 | Zoels | H03K 17/0812 |
| | | | 327/109 |
| 2018/0248353 A1* | 8/2018 | Creech | H02H 3/08 |
| 2020/0321849 A1* | 10/2020 | Sharma | H02M 1/08 |
| 2022/0173761 A1* | 6/2022 | Nabki | G16H 40/67 |

FOREIGN PATENT DOCUMENTS

| | | |
|---|---|---|
| JP | 3292662 B2 | 6/2002 |
| JP | 2006-129593 A | 5/2006 |
| JP | 2009-21823 A | 1/2009 |
| JP | 4968487 B2 | 7/2012 |
| JP | 2012-147591 A | 8/2012 |
| JP | 2015-80335 A | 4/2015 |
| JP | 6478826 B2 | 3/2019 |
| JP | 2020-27949 A | 2/2020 |
| WO | WO 2019/116825 A1 | 6/2019 |

\* cited by examiner

ELECTRONIC CIRCUITRY, ELECTRONIC SYSTEM, AND DRIVING METHOD

CROSS REFERENCE TO RELATED APPLICATIONS

This application is based upon and claims the benefit of priority from the prior Japanese Patent Application No. 2021-147958, filed on Sep. 10, 2021, the entire contents of which are incorporated herein by reference.

FIELD

The present disclosure relates to electronic circuitry, an electronic system, and a driving method.

BACKGROUND

In a case such as that of a semiconductor switching element being used as a semiconductor relay, a control voltage increasing at a low rate (gradient) is supplied to a control terminal of the semiconductor switching element to turn on the semiconductor switching element at a low speed. This makes it possible to prevent flowing of a large current and occurrence of overvoltage in the semiconductor switching element when the semiconductor switching element is turned on. However, in the middle of the increase of the control voltage, a noise signal may be mixed at the control voltage close to a threshold voltage, which may cause chattering (fluctuation) of the control voltage. If the chattering occurs, the semiconductor switching element is repeatedly turned on and off in a short time at the control voltage close to the threshold voltage, which causes erroneous operation of the semiconductor switching element.

DETAILED DESCRIPTION

Figure 1:
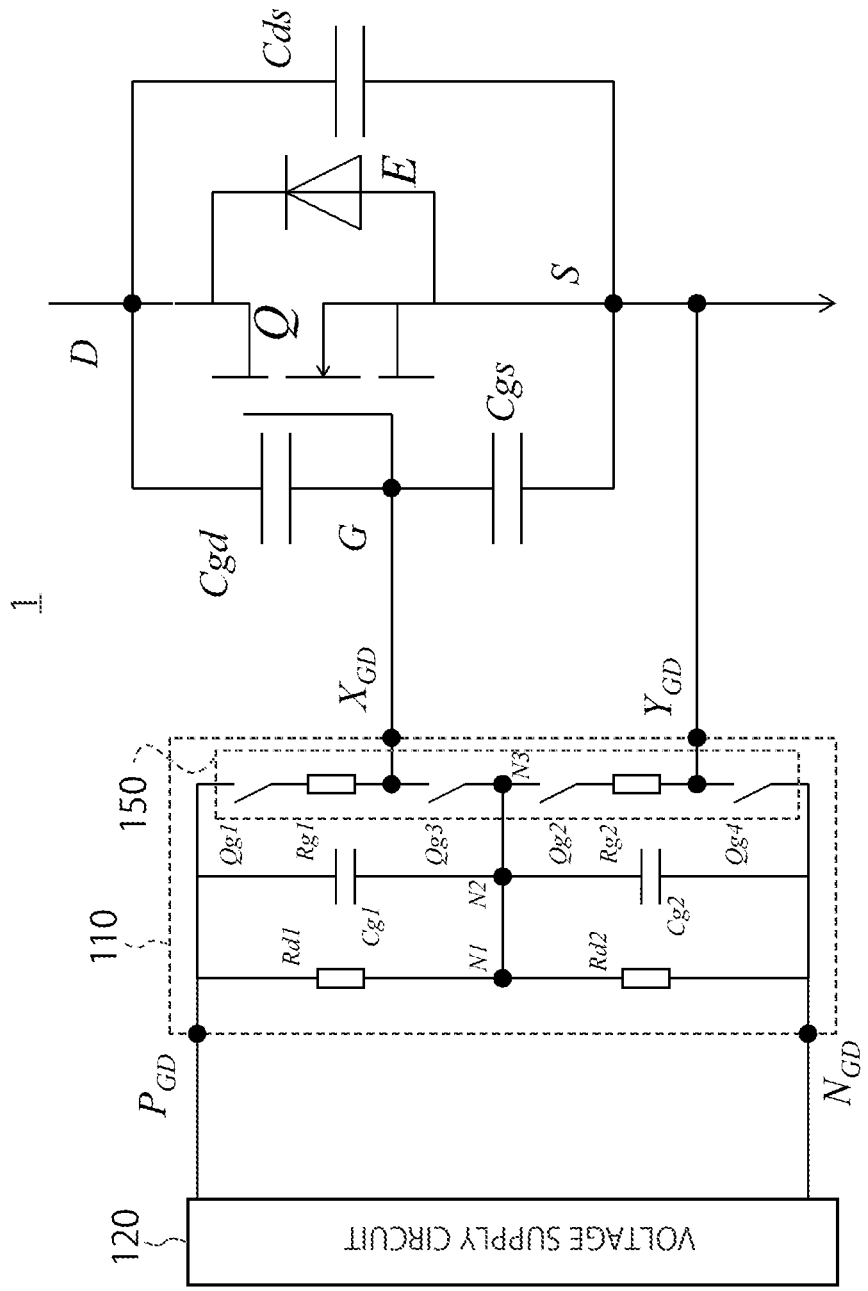
FIG. 1 is a block diagram of electronic circuitry according to a first embodiment.

According to one embodiment, electronic circuitry includes a semiconductor switching element; and a driving circuit configured to supply a current to a control terminal of the semiconductor switching element and to adjust a magnitude of the current supplied to the control terminal based on a voltage at the control terminal.

Some embodiments of the present invention are described below with reference to drawings. In the drawings, the same components are denoted by the same reference numerals, and descriptions of the components are appropriately omitted. An embodiment of a power conversion device is described below with reference to the drawings. In the following, main components of electronic circuitry, an electronic system, and a driving device are mainly described; however, the electronic circuitry, the electronic system, and the driving device each may include components and functions that are not illustrated or described. The following description does not exclude the components and functions that not illustrated or described.

First Embodiment

FIG. 1 is a block diagram of electronic circuitry 1 according to a first embodiment. The electronic circuitry 1 includes a semiconductor switching element Q, a driving circuit 110 driving the semiconductor switching element Q, and a voltage supply circuit 120 supplying an operation voltage to the driving circuit 110. The driving circuit 110 includes a first circuit 150 having an adjustable impedance, and the first circuit 150 is connected to a control terminal of the semiconductor switching element Q. In the following, overview of the electronic circuitry 1 is first described.

The semiconductor switching element Q is usable as a semiconductor relay connected to a middle of a wire connecting, for example, a power supply and a load device (for example, DC-DC converter).

The driving circuit 110 generates a current to be supplied to the control terminal (gate terminal G) of the semiconductor switching element Q based on the voltage supplied from the voltage supply circuit 120, and supplies the generated current to the control terminal of the semiconductor switching element Q. The supplied current charges a parasitic capacitance Cgs between a gate and a source of the semiconductor switching element Q. As a result, the voltage at the control terminal of the semiconductor switching element Q increases. An increase rate (gradient) depends on a magnitude of the current supplied to the control terminal. The driving circuit 110 supplies a current (first current) having a low magnitude at start of operation. Therefore, the voltage at the control terminal increases at a low rate.

After the supply of the current is started, when the voltage at the control terminal becomes a value (first reference value) less than a threshold voltage, namely, is close to the threshold voltage, the driving circuit 110 increases the current to be supplied, to a second current. This increases the voltage at the control terminal at a high rate, and the voltage at the control terminal rapidly increases in a short time. During the period, the control voltage reaches the threshold voltage, and the semiconductor switching element Q is turned on.

When the voltage at the control terminal reaches a value (second reference value) greater than the threshold voltage, the driving circuit 110 reduces the current to a third current. The third current may have the magnitude same as the magnitude of the original current (first current).

During a period when the control voltage is close to the threshold voltage, increasing the magnitude of the current to be supplied makes it possible to reduce a time when the voltage at the control terminal is close to the threshold voltage. As a result, it is possible to prevent occurrence of chattering in the control voltage caused by mixing of a noise signal or the like at the time of turning-on operation. This makes it possible to prevent occurrence of erroneous operation in which the semiconductor switching element Q is repeatedly turned on and off at the control voltage close to the threshold voltage. Further, during a period other than the period when the control voltage is close to the threshold voltage, the control voltage increases at a low rate. This makes it possible to prevent a large current from flowing into the semiconductor switching element Q when the semiconductor switching element Q is turn on, and the like, and to safely start up the semiconductor switching element.

As described above, the electronic circuitry according to the present embodiment prevents occurrence of chattering at the voltage close to the threshold voltage while increasing the control voltage at a low through rate. In the following, the electronic circuitry 1 in FIG. 1 is described in more detail.

A voltage supply circuit 120 in FIG. 1 supplies the operation voltage for the driving circuit 110. The operation voltage to be supplied is a direct-current voltage. The voltage supply circuit 120 may rectify a voltage of an unillustrated alternating-current power supply, decrease or increase the rectified voltage, thereby generating a voltage to be supplied to the driving circuit 110. Alternatively, the voltage supply circuit 120 may be a photocoupler generating a voltage (current) from a received optical signal.

The semiconductor switching element Q is an MOS transistor such as a power MOSFET. Alternatively, the semiconductor switching element Q may be other types of semiconductor transistor such as an IGBT. In FIG. 1, an example in which the semiconductor switching element Q is an N-type power MOSFET is illustrated; however, the semiconductor switching element Q may be a P-type power MOSFET.

The semiconductor switching element Q includes a parasitic diode E between a drain terminal D (second terminal) and a source terminal S (first terminal), a parasitic capacitance Cds between the drain terminal D and the source terminal S, the parasitic capacitance Cgs between the gate terminal G and the source terminal S, and a parasitic capacitance Cgd between the gate terminal G and the drain terminal D. As an example, the drain terminal D can be connected to a negative output terminal of the power supply, and the source terminal S can be connected to a negative input terminal of a load device (for example, DC-DC converter).

The driving circuit 110 generates a current having a magnitude corresponding to the voltage (control voltage or gate voltage) at the gate terminal G of the semiconductor switching element Q and gate resistances Rg1 and Rg2, based on the voltage supplied from the voltage supply circuit 120. The driving circuit 110 supplies the generated current to the gate terminal G. The driving circuit 110 adjusts or switches the magnitude of the current to be supplied, based on a value of the gate voltage of the semiconductor switching element Q. The supplied current is charged in the parasitic capacitance Cgs, and the gate voltage increases.

The driving circuit 110 supplies the first current during a period (first period) until the gate voltage reaches the first reference value less than the threshold voltage of the semiconductor switching element Q.

When the gate voltage exceeds the first reference value, the driving circuit 110 changes the current to be supplied, to the second current that has a magnitude greater than the magnitude of the first current. The driving circuit 110 supplies the second current during a period (second period) until the gate voltage reaches the second reference value greater than the threshold voltage of the semiconductor switching element Q.

When the gate voltage reaches the second reference value greater than the threshold voltage of the semiconductor switching element Q, the driving circuit 110 changes the current to be supplied, to the third current having a magnitude less than the magnitude of the second current. The third current may have the magnitude same as or different from the magnitude of the first current. A period when the third current is used after the second period corresponds to a third period. As an example, the third period may be a period until turning-off operation of the semiconductor switching element Q is started after the second period, or may be a period after a predetermined time elapses from end of the second period.

As a result, the gate voltage increases at a high rate during the period (area) when the gate voltage is close to the threshold voltage, and the gate voltage increases at a low rate in the other area. This prevents occurrence of chattering in the gate voltage close to the threshold voltage. A specific configuration of the driving circuit 110 is described below.

The driving circuit 110 includes a node $P_{GD}$ connected to a positive terminal of the voltage supply circuit 120, and a node $N_{GD}$ connected to a negative terminal of the voltage supply circuit 120. Resistances (divided resistances) Rd1 and Rd2 are connected in series between the nodes $P_{GD}$ and $N_{GD}$. A connection node between the divided resistances Rd2 and Rd1 corresponds to a node N1.

A capacitance Cg1 and a capacitance Cg2 are connected in series between the nodes $P_{GD}$ and $N_{G}D$. A connection node between the capacitances Cg1 and Cg2 corresponds to a node N2. The capacitances Cg1 and Cg2 are respectively connected in parallel with the divided resistances Rd1 and Rd2. The capacitance Cg1 holds the first voltage, and the capacitance Cg2 holds the second voltage.

The first circuit 150 is connected between the nodes $P_{GD}$ and $N_{G}D$. The first circuit 150 includes a switch Qg1 (first switch), a resistive element Rg1 (first resistive element), a switch Qg3 (second switch), a switch Qg2 (third switch), a resistive element Rg2 (second resistive element), and a switch Qg4 (fourth switch) that are connected in series. Controlling on/off of each of the switches Qg1 to Qg4 makes it possible to adjust the impedance (resistance) of the first circuit 150.

The switch Qg1, the resistive element Rg1, and the switch Qg3 connected in series are connected in parallel with the capacitance Cg1. The switch Qg2, the resistive element Rg2, and the switch Qg4 connected in series are connected in parallel with the capacitance Cg2. A connection node between the switch Qg3 and the switch Qg2 corresponds to a node N3.

The switch Qg1 and the resistive element Rg1 are connected in series between a first terminal of the capacitance Cg1 (or potential at first terminal of capacitance Cg1) and the gate terminal G. The switch Qg3 is connected between a first terminal of the capacitance Cg2 (or second potential at first terminal of capacitance Cg2) and the gate terminal G. The switch Qg2 and the resistive element Rg2 are connected in series between a second terminal of the capacitance Cg1 and the source terminal S (first terminal) of the semiconductor switching element Q. The switch Qg4 is connected between a second terminal of the capacitance Cg2 and the source terminal S of the semiconductor switching element Q.

The driving circuit 110 includes a node $X_{GD}$ connected to the gate terminal G of the semiconductor switching element Q, and a node $Y_{GD}$ connected to the source terminal S of the semiconductor switching element Q.

The driving circuit 110 adjusts the impedance (resistance) of the first circuit 150 by controlling on/off of each of the switches Qg1 to Qg4, thereby controlling the magnitude of the current to be supplied to the gate terminal of the semiconductor switching element Q.

Figure 2:
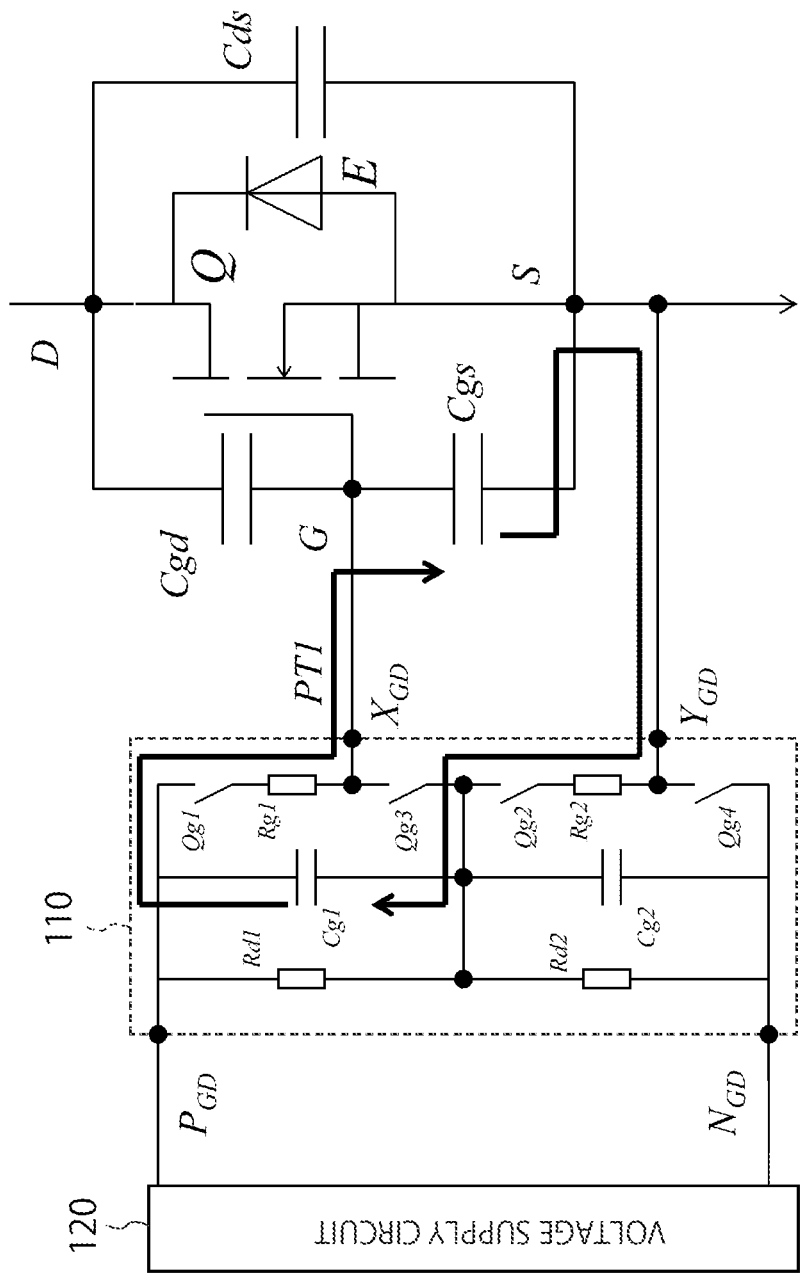
FIG. 2 is a diagram illustrating an example of a current path.

FIG. 2 illustrates a path PT1 of a current flowing when the switches Qg1 and Qg2 are turned on and the switches Qg3 and Qg4 are turned off. The path PT1 is used in a case where the impedance of the first circuit 150 is increased and a small current is supplied. The path PT1 is used during the above-described first period (period until gate voltage Vgs reaches first reference value after control signal to turn on switches Q1 and Q2 is input to each of switches Q1 and Q2) and during the above-described third period (period after gate voltage Vgs reaches second reference value). A current having a magnitude corresponding to the impedance (resistance) of the path PT1 is supplied to the gate terminal G based on the voltage (first voltage) held by the capacitance Cg1. The path PT1 passes through the resistive elements Rg1 and Rg2 in an outward route and a return route of the current that is output from the capacitance Cg1 and charges the parasitic capacitance Cgs, respectively. Since the path PT1 passes through the resistive elements Rg1 and Rg2, the path PT1 has a high resistance value or a high impedance value, and the current supplied to the gate terminal G is reduced. Therefore, the parasitic capacitance Cgs of the semiconductor switching element Q is charged at a low speed. As a result, the gate voltage increases at a low rate.

Figure 3:
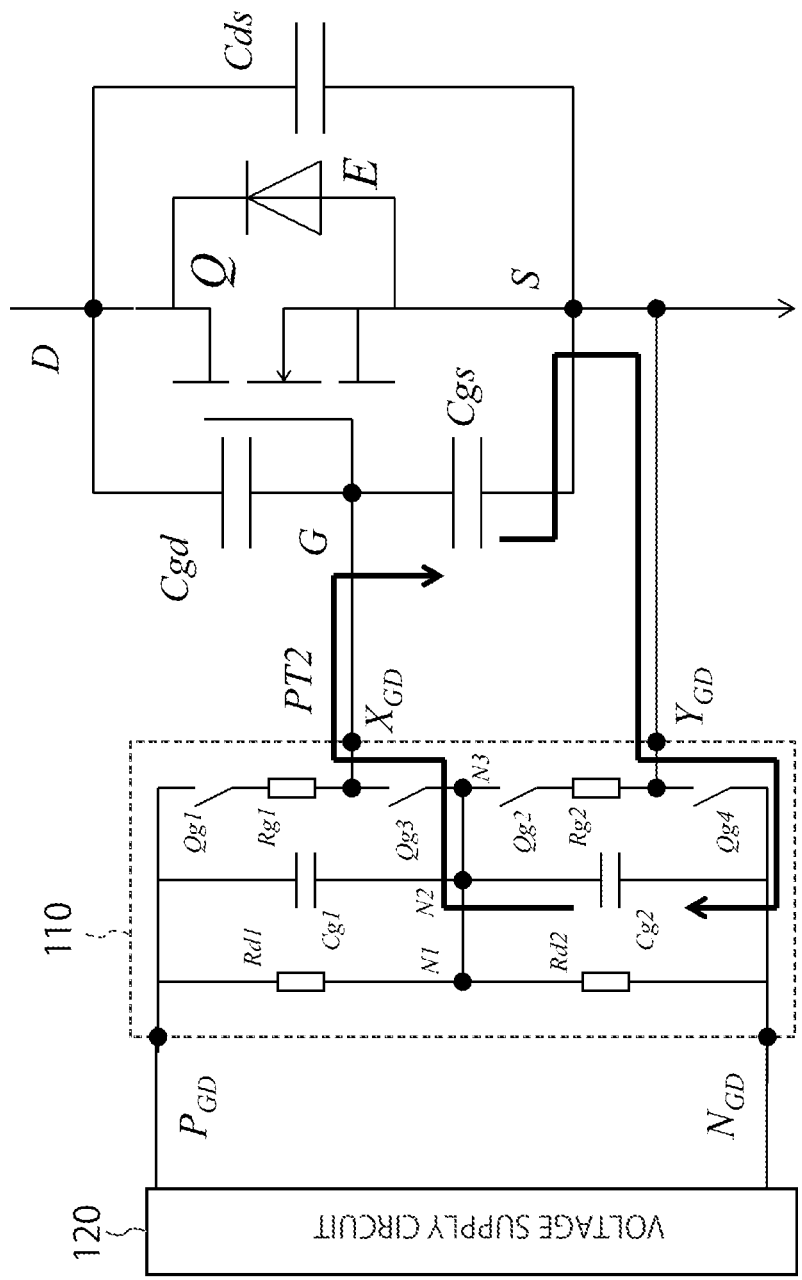
FIG. 3 is a diagram illustrating another example of the current path.

FIG. 3 illustrates a path PT2 of a current flowing when the switches Qg3 and Qg4 are turned on and the switches Qg1 and Qg2 are turned off. The path PT2 is used in a case where the impedance of the first circuit 150 is reduced and a large current is supplied. More specifically, the path PT2 is used during the above-described second period (period until gate voltage Vgs reaches second reference value after gate voltage Vgs reaches first reference value). A current corresponding to an impedance (resistance) of the path PT2 is supplied to the gate terminal G based on the voltage (second voltage) held by the capacitance Cg2. The path PT2 does not pass through the resistive elements Rg1 and Rg2. The path PT2 has a resistance value or an impedance value lower than the resistance value or the impedance value of the path PT1, and the current supplied to the gate terminal G is increased. Therefore, the parasitic capacitance Cgs of the semiconductor switching element Q is charged at a high speed, and the gate voltage increases at a high rate.

Note that the voltage (potential difference) held by the capacitance Cg2 and the voltage (potential difference) held by the capacitance Cg1 may be equal to each other or different from each other as long as the magnitude of the current to be supplied to the gate terminal G is adjustable to a desired magnitude.

Figure 4:
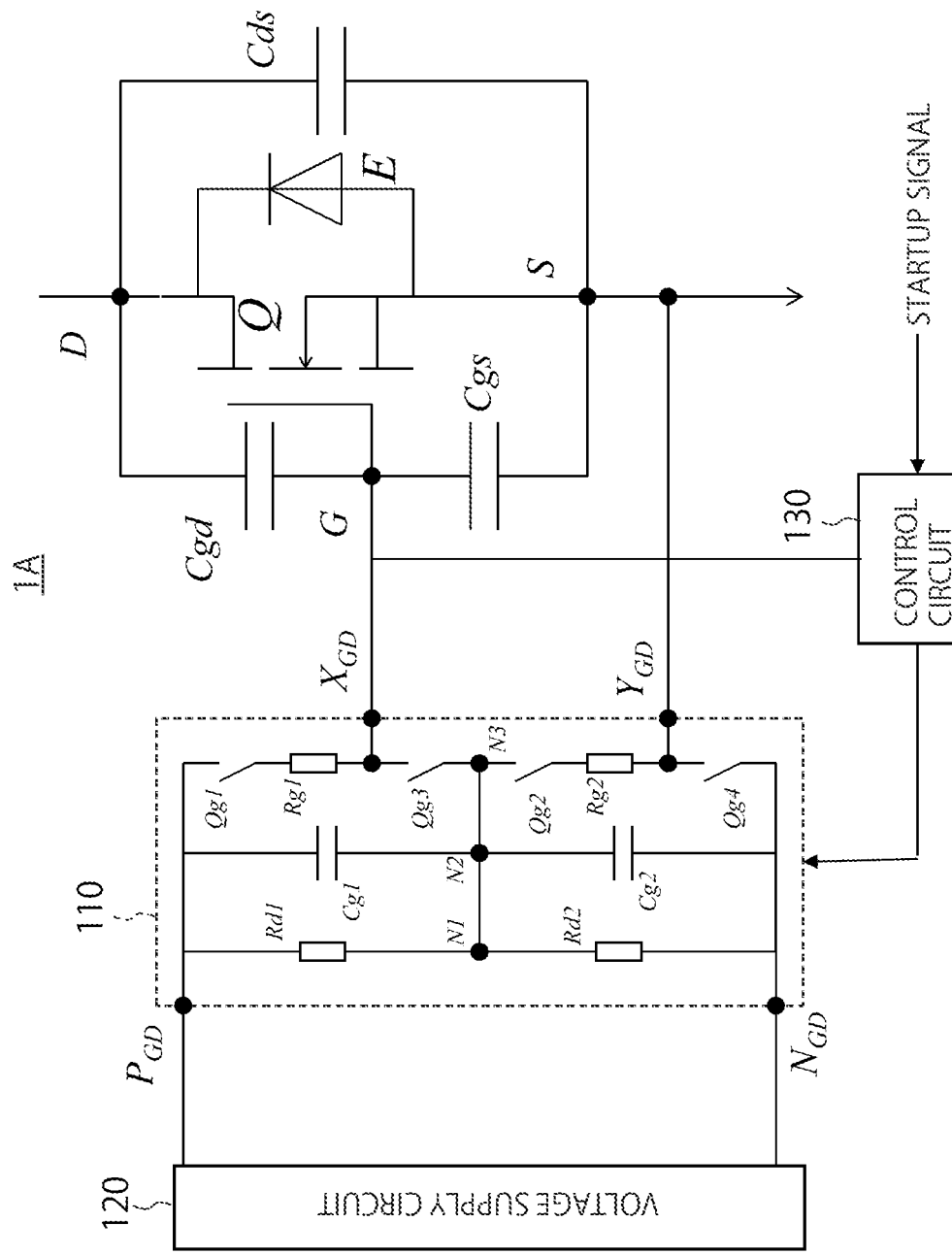
FIG. 4 is a block diagram illustrating an example of electronic circuitry including a control circuit.

The driving circuit 110 puts the switches Qg1 to Qg4 into the state illustrated in FIG. 2 during the first period and during the third period, and puts the switches Qg1 to Qg4 into the state illustrated in FIG. 3 during the second period. As a specific configuration example to control the switches Qg1 to Qg4 based on the control voltage, a control circuit that detects the gate voltage and controls the driving circuit 110 based on the detected gate voltage may be provided. The control circuit compares the gate voltage with the first reference value and the second reference value, and controls the switches Qg1 to Qg4 based on a result of the comparison. FIG. 4 illustrates a configuration example in this case.

FIG. 4 illustrates an example of electronic circuitry 1A including a control circuit 130. When receiving a startup signal from an external circuit, the control circuit 130 turns on the switches Qg1 and Qg2 and turns off the switches Qg3 and Qg4 (see FIG. 2). When the gate voltage reaches the first reference value (value less than threshold voltage), the control circuit 130 turns off the switches Qg1 and Qg2, and turns on the switches Qg3 and Qg4 (see FIG. 3). When the gate voltage reaches the second reference value (value greater than threshold voltage), the control circuit 130 again turns on the switches Qg1 and Qg2 and turns off the switches Qg3 and Qg4 (see FIG. 2). As a specific example of the control circuit 130, the control circuit 130 may include a voltage detection circuit detecting the gate voltage, and may further include a first comparator circuit that compares the first reference value and the gate voltage and generates control signals for the switches Qg1 and Qg4 based on a result of the comparison. The control circuit 130 may further include a second comparator circuit that compares the second reference value and the gate voltage and generates control signals for the switches Qg1 to Qg4 based on a result of the comparison.

As another configuration example to control the switches Qg1 to Qg4, lengths of the first period and the second period may be previously set, and the driving circuit 110 may control the switches Qg1 to Qg4 based on an elapsed time from start of the operation. For example, a first timer detecting lapse of the first period and a second timer detecting lapse of the second period are provided in the electronic circuitry 1. In response to input of the startup signal, the electronic circuitry 1 turns on the switches Qg1 and Qg2 and turns off the switches Qg3 and Qg4, as well as starts up the first timer and the second timer. The length of the first period is set to the first timer, and a total length of the first period and the second period is set to the second timer. When the first timer times out, a timeout signal is output, and the driving circuit 110 turns off the switches Qg1 and Qg2 and turns on the switches Qg3 and Qg4 in response to the timeout signal. When the second timer times out, a timeout signal is output, and the driving circuit 110 turns on the switches Qg1 and Qg2 and turns off the switches Qg3 and Qg4 in response to the timeout signal. Likewise, for the third period as well, a timer detecting lapse of the third period may be provided.

A specific configuration to control the switches Qg1 to Qg4 may be realized by a method other than the above-described method.

Figure 5:
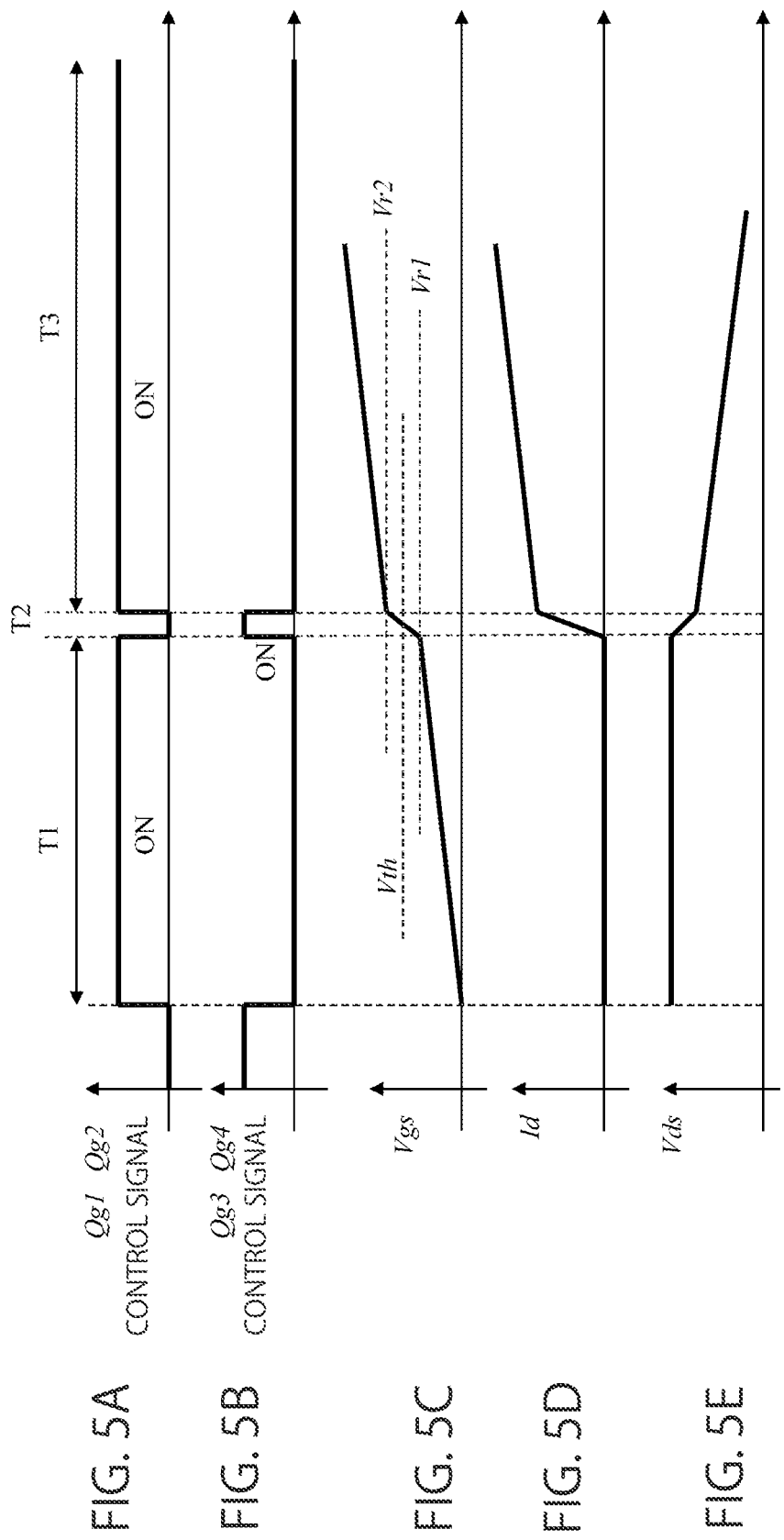
FIGS. 5A, 5B, 5C, 5D, and 5E each are timing charts of the electronic circuitry in FIG. 1.

FIG. 5 is a timing chart of the electronic circuitry 1 in FIG. 1. More specifically, FIG. 5 is as follows.

FIG. 5A is a timing chart of the control signal (on/off signal) for the switches Qg1 and Qg2.

FIG. 5B is a timing chart of the control signal for the switches Qg3 and Qg4.

FIG. 5C is a timing chart of the gate voltage (voltage Vgs) of the semiconductor switching element Q.

FIG. 5D is a timing chart of the current supplied to the gate terminal G of the semiconductor switching element Q.

FIG. 5E is a timing chart of a drain-source voltage Vds of the semiconductor switching element Q.

During the first period until the gate voltage reaches a first reference value Vr1 less than a threshold Vth after start of operation, the parasitic capacitance Cgs of the semiconductor switching element Q is charged at a low speed through the resistive elements Rg1 and Rg2 by turning on the switches Qg1 and Qg2 and turning off the switches Qg3 and Qg4. In other words, the gate voltage is gently increased (at low rate). During the first period, a drain current Id does not flow through the semiconductor switching element Q, and the drain-source voltage Vds is maintained at a high value.

When the gate voltage reaches the first reference value Vr1, the switches Qg1 and Qg2 are turned off and the switches Qg3 and Qg4 are turned off, and the parasitic capacitance Cgs of the semiconductor switching element Q is charged at a high speed for a short time (during second period). The gate voltage is increased at a high rate, and exceeds the threshold Vth in a short time. At this time, the drain current Id is increased with a large gradient, and the drain-source voltage Vds is accordingly reduced with a large gradient.

After lapse of the second period, namely, after the gate voltage reaches the second reference value Vr2 greater than the threshold Vth, the switches Qg1 and Qg2 are turned on and the switches Qg3 and Qg4 are turned off as in the first period. As a result, the parasitic capacitance Cgs of the semiconductor switching element Q is charged at a low speed. In other words, the gate voltage is gently increased (at low rate). At this time, the gradient of the drain current Id is reduced, and the reduction gradient of the drain-source voltage Vds is accordingly reduced. Thereafter, the magnitude of the current supplied to the gate terminal G is converged and the gate voltage Vgs is converged to a predetermined value based on a charging amount of the parasitic capacitance Cgs of the semiconductor switching element Q.

Figure 6:
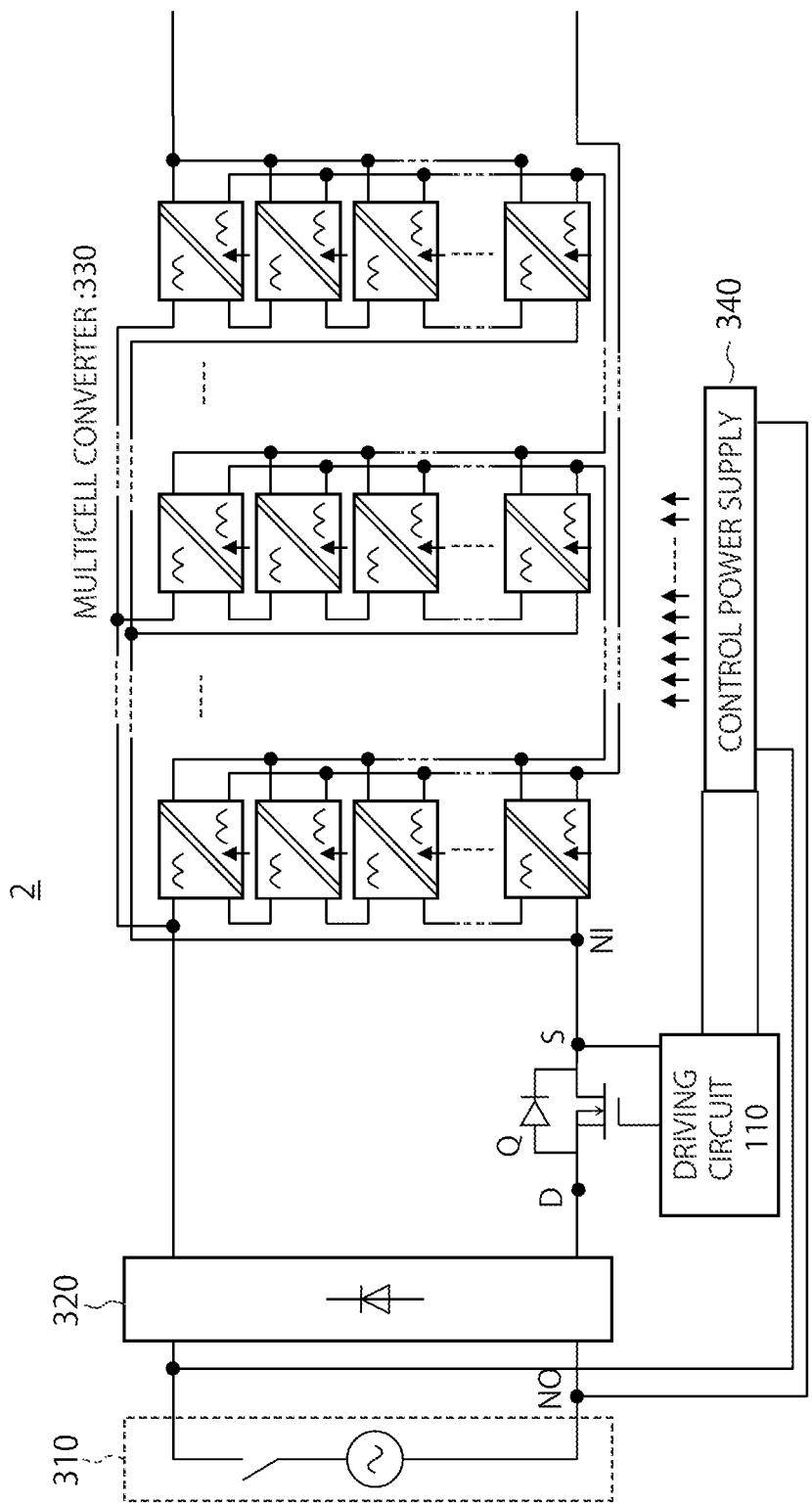
FIG. 6 is a block diagram illustrating an example of an electronic system using the electronic circuitry in FIG. 1.

FIG. 6 is a block diagram illustrating an example of an electronic system 2 using the electronic circuitry 1 in FIG. 1. In the example in FIG. 6, a semiconductor relay (semiconductor switching element Q) is provided as a switch between a rectifier 320 that rectifies an alternating-current voltage supplied from a commercial power supply 310 (distribution board or the like) and a multicell converter 330 (DC-DC converter) as a load device. At this time, the driving circuit 110 in FIG. 1 is used to control the semiconductor switching element Q. The multicell converter 330 reduces or increases the direct-current voltage rectified by the rectifier 320, and outputs the reduced or increased voltage to a device on a post stage. The multicell converter 330 may output a voltage equivalent to the input voltage. In place of the commercial power supply 310 and the rectifier 320, a direct-current power supply such as a storage battery may be used. The configuration of the multicell converter 330 illustrated in FIG. 6 is illustrative, and the configuration is not particularly limited. The example of the multicell converter 330 illustrated in FIG. 6 includes a plurality of cell blocks each including a plurality of cells in which input terminals are connected in series and output terminals are connected in parallel. The input terminals of the plurality of cell blocks are connected in parallel between terminals of the rectifier 320, and output terminals of the plurality of cell blocks are connected in series between output terminals of the multicell converter 330.

A control power supply 340 generates an operation voltage for the driving circuit 110 in the electronic circuitry 1 by using the alternating-current voltage supplied from the commercial power supply 310. The control power supply 340 may include at least one of the voltage supply circuit 120 in FIG. 1 and the control circuit 130 in FIG. 5. The control power supply 340 provides the generated operation voltage to the driving circuit 110. Further, the control power supply 340 controls each of the cells in the multicell converter 330. The control power supply 340 may supply a startup signal controlling startup of the driving circuit 110, to the driving circuit 110 or the electronic circuitry 1.

The drain terminal D (second terminal) of the semiconductor switching element Q is electrically connected to a negative output terminal NO of the commercial power supply 310 or a negative output terminal of the rectifier 320. The source terminal S of the semiconductor switching element Q is connected to a negative input terminal NI of the multicell converter 330.

At startup of the electronic system in FIG. 6, it is necessary to turn on the semiconductor switching element Q. The driving circuit 110 starts turning-on operation of the semiconductor switching element Q under the control of the control power supply 340 (see FIG. 5). At this time, a noise signal is generated from the multicell converter 330 or an unillustrated peripheral device, and the generated noise signal may be input to the gate terminal G of the semiconductor switching element Q or the like. Even in a case where the noise signal is input to the gate terminal G or the like, the gate voltage is increased at a high speed in a short time during the period when the gate voltage is close to the threshold voltage. Therefore, generation of chattering caused by the noise signal is prevented. During a period other than the short period when the gate voltage is increased at a high speed, the gate voltage is increased at a low speed. Therefore, the semiconductor switching element Q can be safely turned on, and the electronic system 2 can be safely started up.

As described above, according to the present embodiment, at the timing when the gate voltage of the semiconductor switching element is close to the threshold voltage, the gate voltage is increased at a high speed in a short time so as to exceed the threshold voltage. This makes it possible to avoid occurrence of chattering caused by mixing of the noise signal when the gate voltage is close to the threshold voltage.

(Modification 1)

The path PT1 in FIG. 2 includes the two resistive elements Rg1 and Rg2; however, the resistive element Rg2 may be removed. In place of the resistive element Rg2 or together with the resistive element Rg2, the resistive element Rg1 may be removed. In a case where at least one of the resistive elements Rg1 and Rg2 is removed, the internal resistance of at least one of the switches Qg1 and Qg2 may be adjusted to set the impedance to a desired value, and the current having the desired magnitude may be supplied to the gate terminal G. This makes it possible to reduce the number of elements and to reduce a circuit area.

(Modification 2)

In FIG. 1, the two capacitances Cg1 and Cg2 may be removed. In this case, the voltage (first voltage) generated by the divided resistance Rd1 and the voltage (second voltage) generated by the divided resistance Rd2 may be directly provided to the first circuit 150. This makes it possible to reduce the number of elements and to reduce a circuit area.

(Modification 3)

In FIG. 1, the two divided resistances Rd1 and Rd2 may be removed, and the first voltage and the second voltage may be respectively directly charged to the capacitance Cg1 and the capacitance Cg2. This makes it possible to reduce the number of elements and to reduce a circuit area.

Second Embodiment

Figure 7:
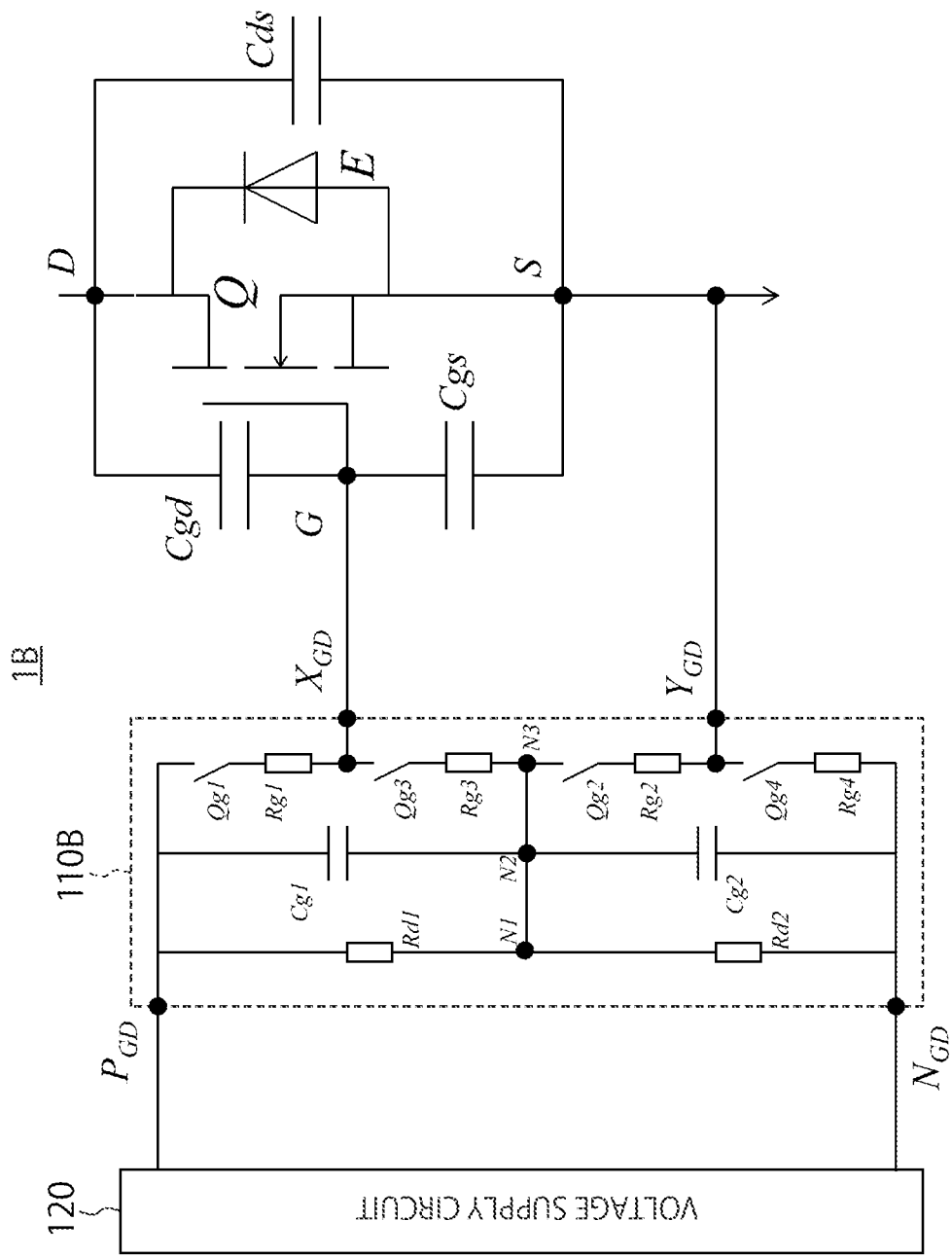
FIG. 7 is a block diagram of electronic circuitry according to a second embodiment.

FIG. 7 is a block diagram of electronic circuitry 1B according to a second embodiment. A driving circuit 110B is provided with resistive elements Rg3 and Rg4. The resistive elements Rg3 and Rg4 are disposed along the path PT2 illustrated in FIG. 3 described above. In other words, the resistive elements Rg3 and Rg4 are included in a path of a current when the switches Qg3 and Qg4 are turned on during the second period. The resistive element Rg3 and the switch Qg3 are connected in series between the first terminal of the capacitance Cg2 and the gate terminal G. The resistive element Rg4 and the switch Qg4 are connected in series between the second terminal of the capacitance Cg2 and the source terminal S (first terminal).

The resistive element Rg3 is connected between the switch Qg3 and the switch Qg2. The resistive element Rg3 is connected between the node N3 and the switch Qg3. The switch Qg1, the resistive element Rg1, the switch Qg3, and the resistive element Rg3 connected in series are connected in parallel with the capacitance Cg1. The resistive element Rg4 is connected to one end of the switch Qg4, and the other end of the switch Qg4 is connected to the resistive element Rg2. In addition, the switch Qg2, the resistive element Rg2, the switch Qg4, and the resistive element Rg4 connected in series are connected in parallel with the capacitance Cg2.

When the resistive elements Rg3 and Rg4 are added along the path PT2, the resistance (impedance) of the path PT2 is increased. This makes it possible to adjust (suppress) the increase rate of the gate voltage (magnitude of current supplied to gate terminal) during the second period, to a desired value. Variable resistive elements may be used as the resistive elements Rg3 and Rg4, and resistance values of the resistive elements Rg3 and Rg4 may be adjusted. This makes it possible to more flexibly adjust the increase rate of the gate voltage.

In FIG. 7, the two resistive elements Rg3 and Rg4 are added; however, only at least one of the resistive elements may be added.

Further, the impedance of the first circuit 150 may be adjusted by adjusting internal resistance values of the switches Qg3 and Qg4 in place of addition of the two resistive elements. This also makes it possible to adjust the increase rate of the gate voltage (magnitude of current supplied to gate terminal) during the second period.

As described above, according to the second embodiment, the increase rate of the gate voltage during the second period can be adjusted (suppressed) to the desired value by adding the resistive elements to the path PT2.

Third Embodiment

Figure 8:
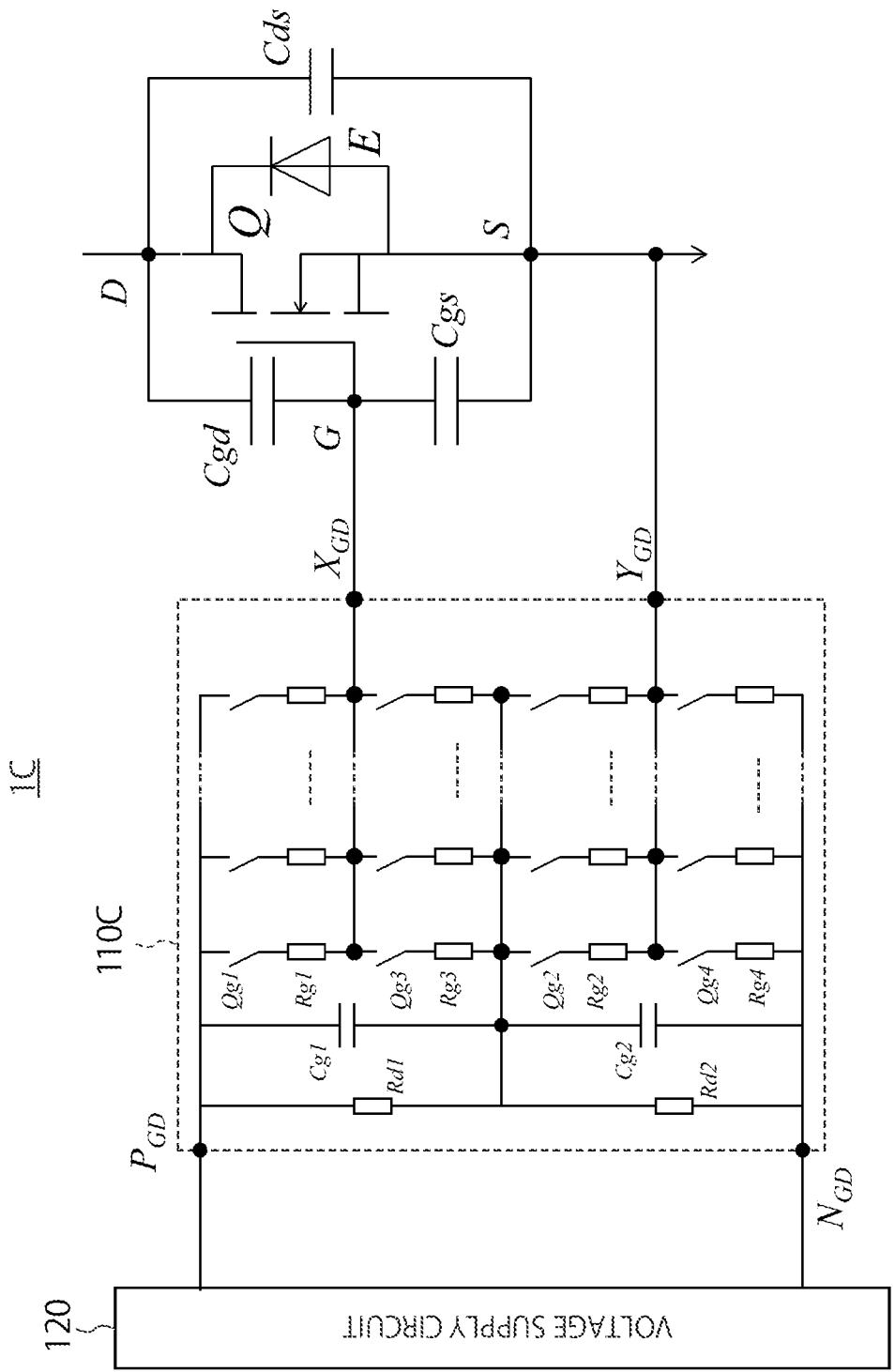
FIG. 8 is a block diagram of electronic circuitry according to a third embodiment.

FIG. 8 is a block diagram of electronic circuitry 1C according to a third embodiment. A driving circuit 110C includes a plurality of switches Qg1, a plurality of resistive elements Rg1, a plurality of switches Qg3, a plurality of resistive elements Rg3, a plurality of switches Qg2, a plurality of resistive elements Rg2, a plurality of switches Qg4, and a plurality of resistive elements Rg4. Each of the switches Qg1 to Qg4 are turned on or off independent of turning-on or off of the other switches Qg1 to Qg4 of the same type. In the driving circuit 110C, a plurality of series connections each including one switch Qg1, one resistive element Rg1, one switch Qg3, and one resistive element Rg3 are connected in parallel with the capacitance Cg1. Likewise, a plurality of series connections each including one switch Qg2, one resistive element Rg2, one switch Qg4, and one resistive element Rg4 are connected in parallel with the capacitance Cg2.

In other words, a plurality of series connections each including one switch Qg1 and one resistive element Rg1 are connected in parallel between the first terminal of the capacitance Cg1 and the gate terminal G. A plurality of series connections each including one switch Qg3 and one resistive element Rg3 are connected in parallel between the first terminal of the capacitance Cg2 and the gate terminal G. A plurality of series connections each including one switch Qg2 and one resistive element Rg2 are connected in parallel between the second terminal of the capacitance Cg1 and the source terminal S. A plurality of series connections each including one switch Qg4 and one resistive element Rg4 are connected in parallel between the second terminal of the capacitance Cg2 and the source terminal S.

The other configurations are similar to the configurations of the electronic circuitry 1A in FIG. 7 according to the second embodiment.

With the configuration in FIG. 8, it is possible to more finely adjust the resistance (impedance) of the path PT1 of the current during the first period and during the third period and the resistance (impedance) of the path PT2 of the current during the second period. For example, to reduce the increase rate (gradient) of the gate voltage during the second period, it is sufficient to reduce the number of switches to be turned on in at least one group out of the plurality of switches Qg3 and the plurality of switches Qg4. In contrast, to increase the increase rate (gradient) of the gate voltage during the second period, it is sufficient to increase the number of switches to be turned on in at least one group out of the plurality of switches Qg3 and the plurality of switches Qg4.

Likewise, to reduce the increase rate (gradient) of the gate voltage during the first period or during the third period, it is sufficient to reduce the number of switches to be turned on in at least one group out of the plurality of switches Qg1 and the plurality of switches Qg2. In contrast, to increase the increase rate (gradient) of the gate voltage during the first period or during the third period, it is sufficient to increase the number of switches to be turned on in at least one group out of the plurality of switches Qg1 and the plurality of switches Qg2.

As described above, according to the third embodiment, it is possible to more flexibly adjust the increase rate of the gate voltage during the first period and during the third period and the increase rate of the gate voltage during the second period, to the desired values.

Fourth Embodiment

Figure 9:
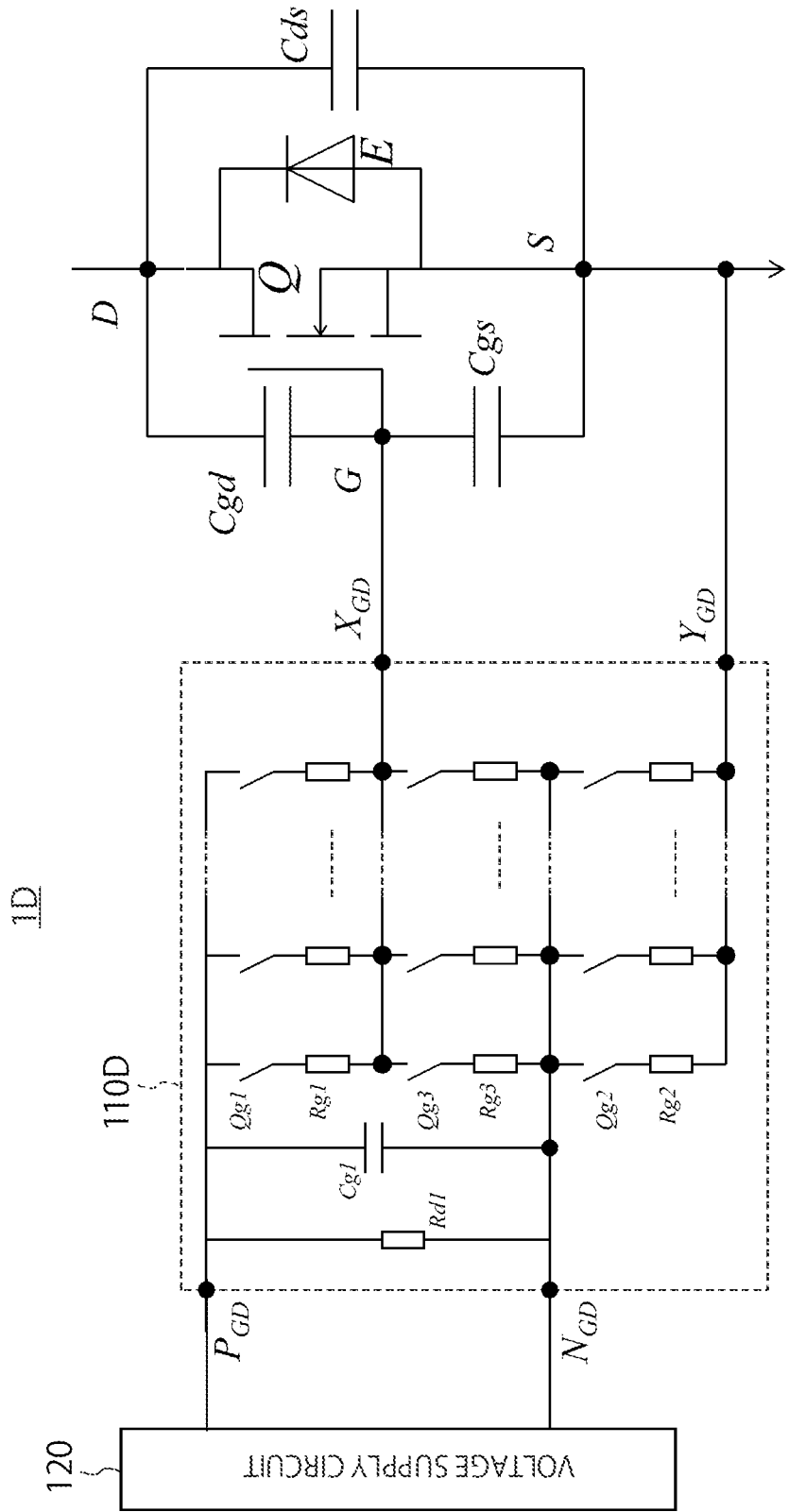
FIG. 9 is a block diagram of electronic circuitry according to a fourth embodiment.

FIG. 9 is a block diagram of electronic circuitry 1D according to a fourth embodiment. Differences with the electronic circuitry 1C in FIG. 8 according to the third embodiment are described. In a driving circuit 110D, the divided resistance Rd2 and the capacitance Cg2 are not provided. Further, the switches Qg4 and the resistive elements Rg4 are not provided. The switches Qg2 and the resistive elements Rg2 are used not only during the first period and during the third period but also during the second period.

As an example, to reduce the increase rate of the gate voltage during the first period and during the third period, the number of switches to be turned on among the plurality of switches Qg2 is reduced. At this time, the increase rate of the gate voltage during the first period and during the third period may be adjusted by also adjusting the number of switches to be turned on among the plurality of switches Qg1. The increase rate of the gate voltage during the first period and during the third period may be more flexibly adjusted by adjusting the number of switches to be turned on among the plurality of switches Qg1 and among the plurality of switches Qg2. The resistance values of the resistive elements Rg1 and the resistance values of the resistive elements Rg3 may be equal to or different from each other.

To make the increase rate of the gate voltage during the second period greater than the increase rate during the first period and during the third period, it is sufficient to make the number of switches to be turned on among the plurality of switches Qg2 during the second period greater than the number of switches to be turned on during the first period and during the third period. At this time, the increase rate of the gate voltage during the second period may be adjusted by also adjusting the number of switches to be turned on among the switches Qg3. The increase rate of the gate voltage during the second period may be more flexibly adjusted by adjusting the number of switches to be turned on among the switches Qg2 and among the switches Qg3. The resistance values of the resistive elements Rg2 and the resistance values of the resistive elements Rg3 may be equal to or different from each other.

As described above, according to the fourth embodiment, the divided resistance Rd2, the capacitance Cg2, the switches Qg4, and the resistive elements Rg4 are removed, and the switches Qg2 and the resistive elements Rg2 are shared by the first period to the third period. This makes it possible to reduce the number of elements and to reduce a size of the electronic circuitry or a size of the driving circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. Electronic circuitry, comprising:
a semiconductor switching element;
a first capacitance for holding a first voltage;
a first resistive element and a first switch connected in series between a first terminal of the first capacitance and a control terminal of the semiconductor switching element;
a second switch connected between a second terminal of the first capacitance and the control terminal of the semiconductor switching element;
a second resistive element and a third switch connected in series between the second terminal of the first capacitance and a first terminal of the semiconductor switching element;
a second capacitance having a first terminal connected to the second terminal of the first capacitance;
a fourth switch connected between a second terminal of the second capacitance and the first terminal of the semiconductor switching element; and
a driving circuit configured to
turn on the first switch and the third switch and turn off the second switch and the fourth switch in a first period, and
turn off the first switch and the third switch and turn on the second switch and the fourth switch in a second period supply.

2. The electronic circuitry according to claim 1, wherein
the first period is a period until a voltage at the control terminal reaches a first reference value less than a threshold voltage of the semiconductor switching element, and
the second period is a period after the voltage of the control terminal reaches the first reference value.

3. The electronic circuitry according to claim 2, wherein the second period is a period until the voltage at the control terminal reaches a second reference value greater than the threshold voltage of the semiconductor switching element after the first period, and
the third period is a period after the second period elapses, in which the first switch and the third switch are turned on and the second switch and the fourth switch are turned off.

4. The electronic circuitry according to claim 1, wherein the fourth switch and a fourth resistive element are connected in series between the second terminal of the second capacitance and the first terminal of the semiconductor switching element.

5. The electronic circuitry according to claim 1, wherein the second switch and a third resistive element are connected in series between the first terminal of the second capacitance and the control terminal of the semiconductor switching element.

6. The electronic circuitry according to claim 1, wherein a plurality of series connections each including the first resistive element and the first switch are connected in parallel.

7. The electronic circuitry according to claim 1, wherein a plurality of series connections each including the second resistive element and the third switch are connected in parallel.

8. The electronic circuitry according to claim 4, wherein a plurality of series connections each including the fourth switch and the fourth resistive element are connected in parallel.

9. The electronic circuitry according to claim 5, wherein a plurality of series connections each including the second switch and the third resistive element are connected in parallel.

10. The electronic circuitry according to claim 1, wherein
a plurality of series connections each including the first resistive element and the first switch are connected in parallel between the first terminal of the first capacitance and the control terminal of the semiconductor switching element,
a plurality of series connections each including the second switch and a third resistive element are connected in parallel between the first terminal of the second capacitance and the control terminal of the semiconductor switching element,
a plurality of series connections each including a second resistive element and the third switch are connected in parallel between a second terminal of the first capacitance and a first terminal of the semiconductor switching element, and
a plurality of series connections each including a fourth switch and the fourth resistive element are connected in parallel between a second terminal of the second capacitance and the first terminal of the semiconductor switching element.

11. The electronic circuitry according to claim 1, further comprising a control circuit configured to detect the voltage at the control terminal and to control the driving circuit based on the detected voltage.

12. An electronic system, comprising:
the electronic circuitry according to claim 1;
a load device connected to a first terminal of the semiconductor switching element;
a power supply connected to a second terminal of the semiconductor switching element; and
a control power supply configured to control the driving circuit.

* * * * *